United States Patent
Petty-Weeks et al.

(10) Patent No.: US 7,164,192 B2
(45) Date of Patent: Jan. 16, 2007

(54) SEMICONDUCTOR DIE PACKAGE WITH REDUCED INDUCTANCE AND REDUCED DIE ATTACH FLOW OUT

(75) Inventors: Sandra L. Petty-Weeks, Newport Beach, CA (US); Patrick L. Welch, Laguna Niguel, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/364,549

(22) Filed: Feb. 10, 2003

(65) Prior Publication Data

US 2004/0155332 A1    Aug. 12, 2004

(51) Int. Cl.
*H01L 23/495* (2006.01)

(52) U.S. Cl. ............... 257/667; 257/675; 257/E23.037

(58) Field of Classification Search ........ 257/686–687, 257/678, 690, 734, 777–778, 784, 667, 410–413, 257/321–322, 336, 344; 438/106–107, 261, 438/287, 216, 585, 586–587, 591, 593, 594, 438/376, 398–399
See application file for complete search history.

(56) References Cited

U.S. PATENT DOCUMENTS

| | | | |
|---|---|---|---|
| 4,771,330 A * | 9/1988 | Long ............................ | 257/672 |
| 5,293,066 A * | 3/1994 | Tsumura ...................... | 257/668 |
| 5,508,556 A * | 4/1996 | Lin .............................. | 257/691 |
| 5,640,048 A * | 6/1997 | Selna .......................... | 257/738 |
| 5,721,450 A * | 2/1998 | Miles .......................... | 257/667 |
| 5,859,477 A * | 1/1999 | Fehr ............................ | 257/796 |
| 5,942,797 A * | 8/1999 | Terasawa ..................... | 257/723 |
| 5,981,314 A * | 11/1999 | Glenn et al. ................. | 438/127 |
| 5,982,018 A * | 11/1999 | Wark et al. .................. | 257/532 |
| 5,989,941 A * | 11/1999 | Wensel ........................ | 438/127 |
| 6,014,318 A * | 1/2000 | Takeda ........................ | 361/764 |
| 6,020,218 A * | 2/2000 | Shim et al. .................. | 438/111 |
| 6,101,708 A * | 8/2000 | Okano et al. ................. | 29/832 |
| 6,117,705 A * | 9/2000 | Glenn et al. ................. | 438/106 |
| 6,150,193 A * | 11/2000 | Glenn ......................... | 438/113 |
| 6,201,302 B1* | 3/2001 | Tzu ............................. | 257/724 |
| 6,291,884 B1* | 9/2001 | Glenn et al. ................. | 257/747 |
| 6,377,464 B1* | 4/2002 | Hashemi et al. ............. | 361/760 |
| 6,459,144 B1* | 10/2002 | Pu et al. ...................... | 257/667 |
| 6,538,305 B1* | 3/2003 | Ichinose ...................... | 257/666 |
| 6,600,232 B1* | 7/2003 | Chiu et al. ................... | 257/778 |
| 6,627,981 B1* | 9/2003 | Shibata ....................... | 257/678 |
| 6,653,720 B1* | 11/2003 | Kameda ...................... | 257/667 |
| 6,696,752 B1* | 2/2004 | Su et al. ...................... | 257/678 |
| 6,713,849 B1* | 3/2004 | Hasebe et al. ............... | 257/667 |

(Continued)

*Primary Examiner*—Thao X. Le
(74) *Attorney, Agent, or Firm*—Farjami & Farjami LLP (57) ABSTRACT

In one exemplary embodiment, a structure comprises a substrate having a top surface, and a die attach pad situated on the top surface of the substrate. The die attach pad includes a die attach region and at least one substrate ground pad region electrically connected to the die attach region. The die attach pad further includes a die attach stop between the die attach region and the at least one substrate ground pad region. The die attach stop acts to control and limit die attach adhesive flow out to the at least one substrate ground pad region during packaging so that the at least one substrate ground pad region can be moved closer to die attach region so that shorter bond wires for connecting the at least one substrate ground pad region to a die wire bond pad may be used during packaging.

10 Claims, 5 Drawing Sheets

U.S. PATENT DOCUMENTS

| | | |
|---|---|---|
| 6,759,307 B1 * | 7/2004 | Yang .......................... 438/455 |
| 2001/0008305 A1 * | 7/2001 | McLellan et al. ........... 257/692 |
| 2002/0149102 A1 * | 10/2002 | Hashemi et al. ............ 257/706 |
| 2002/0168798 A1 * | 11/2002 | Glenn et al. ................ 438/110 |
| 2002/0190362 A1 * | 12/2002 | Khan et al. .................. 257/678 |
| 2003/0146509 A1 * | 8/2003 | Zhao et al. .................. 257/738 |
| 2003/0179549 A1 * | 9/2003 | Zhong et al. ................ 361/707 |
| 2003/0179556 A1 * | 9/2003 | Zhao et al. .................. 361/760 |

* cited by examiner

SEMICONDUCTOR DIE PACKAGE WITH REDUCED INDUCTANCE AND REDUCED DIE ATTACH FLOW OUT

BACKGROUND OF THE INVENTION

1. Field of the Invention

The present invention is generally in the field of semiconductors. More specifically, the invention is in the field of semiconductor packaging.

2. Related Art

During semiconductor packaging, dice are mounted onto a die attach pad fabricated on a substrate surface. A die adhesive is commonly used to attach the die to the die attach pad. For example, epoxy resin is a common type of die attach adhesive used for this purpose. Such epoxies can be referred to as "die attach epoxies." After the die is mounted on the substrate, bond wires are used to electrically connect die wire bond pads located on the die to their corresponding substrate ground pads and substrate signal pads located on the substrate.

In general, it is desirable to reduce the length of the bond wires used to connect the die wire bond pads to the substrate ground pads and substrate signal pads. A significant advantage, for example, is the reduced inductance of shorter bond wires. On the other hand, inductance in a bond wire increases as the length of the bond wire increases. Dice comprising power amplifier devices are particularly sensitive to the length of the bond wire used to connect a die wire bond pad to a substrate ground pad, and can thus greatly benefit from reduced bond wire lengths. Other advantages associated with shorter bond wires include reduced package sizes and reduced manufacturing costs, both of which are desirable.

However, due to a number of factors, the amount of reduction that can be made to the length of bond wires is extremely limited. For example, when the die is attached to the die attach pad using die attach adhesive, the die attach adhesive naturally flows out beyond the bottom surface of the die and partially extends into the substrate ground pad area. This "flow out" of die attach adhesive extends the distance between the die and the location on the substrate pad to which a bond wire may be attached. This extended distance corresponds to increased bond wire length for connecting the die wire bond pad to the substrate pad.

Longer bond wire lengths may also be required due to the design of the die. For example, as the thickness of the die increases, longer bond wires become necessary. Furthermore, the location of the wire bond pad on the die may also dictate the length of the bond wire required. For example, as wire bond pads are moved away from the edge of the die toward the center of the die, longer bond wires are required.

Accordingly, there is a strong need in the art for a structure and technique which reduces the length of bond wires connecting die wire bond pads to substrate ground pads and/or substrate signal pads during semiconductor die packaging. Furthermore, there is a need in the art for a structure and technique for controlling die attach adhesive flow out during semiconductor die packaging.

SUMMARY OF THE INVENTION

The present invention is directed to a semiconductor die package with reduced inductance and reduced die attach adhesive flow out. The invention overcomes the need in the art for reducing the length of bond wires and the need in the art for controlling die attach adhesive flow out in semiconductor die packaging.

In one exemplary embodiment, a structure comprises a substrate having a top surface, and a die attach pad situated on the top surface of the substrate. The die attach pad includes a die attach region and at least one substrate ground pad region electrically connected to the die attach region. The die attach pad further includes a die attach stop between the die attach region and the at least one substrate ground pad region. The die attach stop acts to control and limit die attach adhesive flow out to the at least one substrate ground pad region during packaging so that the at least one substrate ground pad region can be moved closer to the die attach region so that shorter bond wires for connecting the at least one substrate ground pad region to a die wire bond pad may be used during packaging.

According to one particular embodiment, the die attach stop comprises an opening defined in the die attach pad between the die attach region and the at least one substrate ground pad region. A depth of the opening may be, for example, approximately equal to a height of the die attach pad. A heat spreader may further be situated on a bottom surface of the substrate. Vias in the substrate provide a connection between the at least one substrate ground pad region and the heat spreader.

According to another particular embodiment, the die attach stop comprises a dam situated over and electrically coupled with the at least one substrate ground pad region. The dam includes a top surface and a wall, wherein the wall extends from the top surface of the dam to the at least one substrate ground pad region. A heat spreader may further be situated on a bottom surface of the substrate. Vias in the substrate provide a connection between the at least one substrate ground pad region and the heat spreader.

According to various embodiments of the invention, greater control of die attach adhesive flow out during semiconductor packaging is achieved and, as a result, length of bond wires can be reduced, which leads to reduced inductance. Furthermore, package size can be reduced, and manufacturing costs are also reduced. Other features and advantages of the present invention will become more readily apparent to those of ordinary skill in the art after reviewing the following detailed description and accompanying drawings.

DETAILED DESCRIPTION OF THE INVENTION

The present invention is directed to a semiconductor die package with reduced inductance and reduced die attach adhesive flow out. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings. It is noted that, for ease of illustration, the various elements and dimensions shown in the drawings are not drawn to scale.

Figure 1:
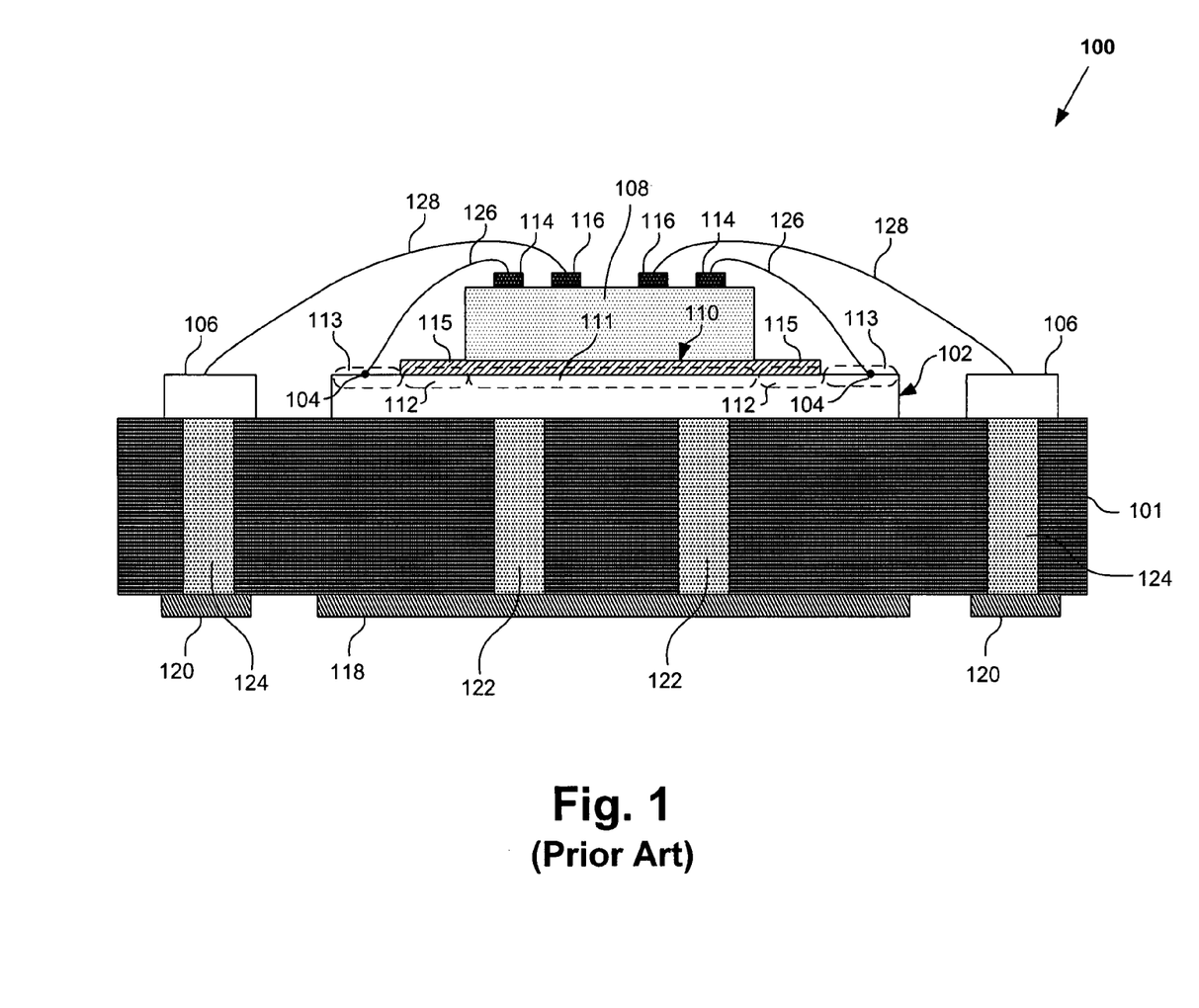
FIG. 1 illustrates a cross-sectional view of a known semiconductor die packaging structure.

To illustrate the features and advantages of the present invention by way of contrast, a brief description of known semiconductor die packaging structure 100 in FIG. 1 is provided. FIG. 1 illustrates known structure 100 comprising substrate 101 having die attach pad 102 on its top surface. Substrate signal pads 106 are also situated on top surface of substrate 101. Lands 120 and heat spreader 118, which may also have an electrical function, are situated on the bottom surface of substrate 101. In the particular embodiment shown in FIG. 1, die attach pad 102 is electrically connected to heat spreader 118 by way of vias 122 while each substrate signal pad 106 is electrically connected to corresponding land 120 by way of corresponding via 124. Sidewalls of vias 122 and 124 may be plated with conductive material to form plated through-holes (PTHs), or vias 122 and 124 may be completely filled with conductive material. Lands 120 and heat spreader 118 can be connected to appropriate contacts in accordance with a particular application, e.g., for connection to a printed circuit board (PCB).

During packaging, die 108 is mounted onto substrate 101. More particularly, die attach adhesive 110 is used to attach die 108 to substrate die attach pad 102 situated on substrate 101. For example, die attach adhesive 110 can comprise a resin having filler material, such as silver flakes. During packaging of die 108, die attach adhesive 110 is applied as a liquid onto the surface of substrate die attach pad 102 typically in die attach region 111 of substrate die attach pad 102. Die 108 is then placed on die attach adhesive 110 with sufficient pressure so as to establish adequate contact between die 108 and die attach adhesive 110. Since die attach adhesive 110 is a liquid during this process, die attach adhesive 110 flows from die attach region 111 into regions 112 of substrate die attach pad 102.

In the present application, die attach adhesive 110 that flows out from under die 108 and into regions 112 is also referred to as "die attach adhesive flow out 115." Die attach adhesive flow out 115 occupies, and more particularly contaminates regions 112 of substrate die attach pad 102, such that each ground pad region 113 of substrate die attach pad 102 (ground pad region 113 is also referred to as "substrate ground pad 113" in the present application) where a wire bond can be made, e.g., at landing area 104, is extended away from die 108. As a consequence of substrate ground pads 113 being extended away from die 108, the reduction that can be made to the length of each bond wire 126 connecting corresponding die wire bond pad 114 to its respective substrate ground pad 113 is severely limited. As a further consequence of substrate ground pads 113 being extended away from die 108, each substrate signal pad 106 is likewise extended away from die 108. Thus, the reduction that can be made to the length of each bond wire 128 connecting corresponding die wire bond pad 116 to its respective substrate signal pad 106 is also severely limited.

Other factors associated with known structure 100 which further limit the ability to decrease lengths of bond wires 126 and 128 include the height of die 108 and the placement of die wire bond pads 114 and 116 on die 108. For example, as the height of die 108 increases, corresponding increases in the length of bond wires 126 and 128 are required. Also, as die wire bond pads 114 and 116 are situated closer to the center of die 108 and away from the edge of die 108, corresponding increases in the length of bond wires 126 and 128 are also required. Altogether, known structure 100 requires the use of lengthy bond wires 126 and 128, resulting in increased inductance through bond wires 126 and 128. Furthermore, known structure 100 results in increased package size and increased manufacturing costs.

Figure 2A:
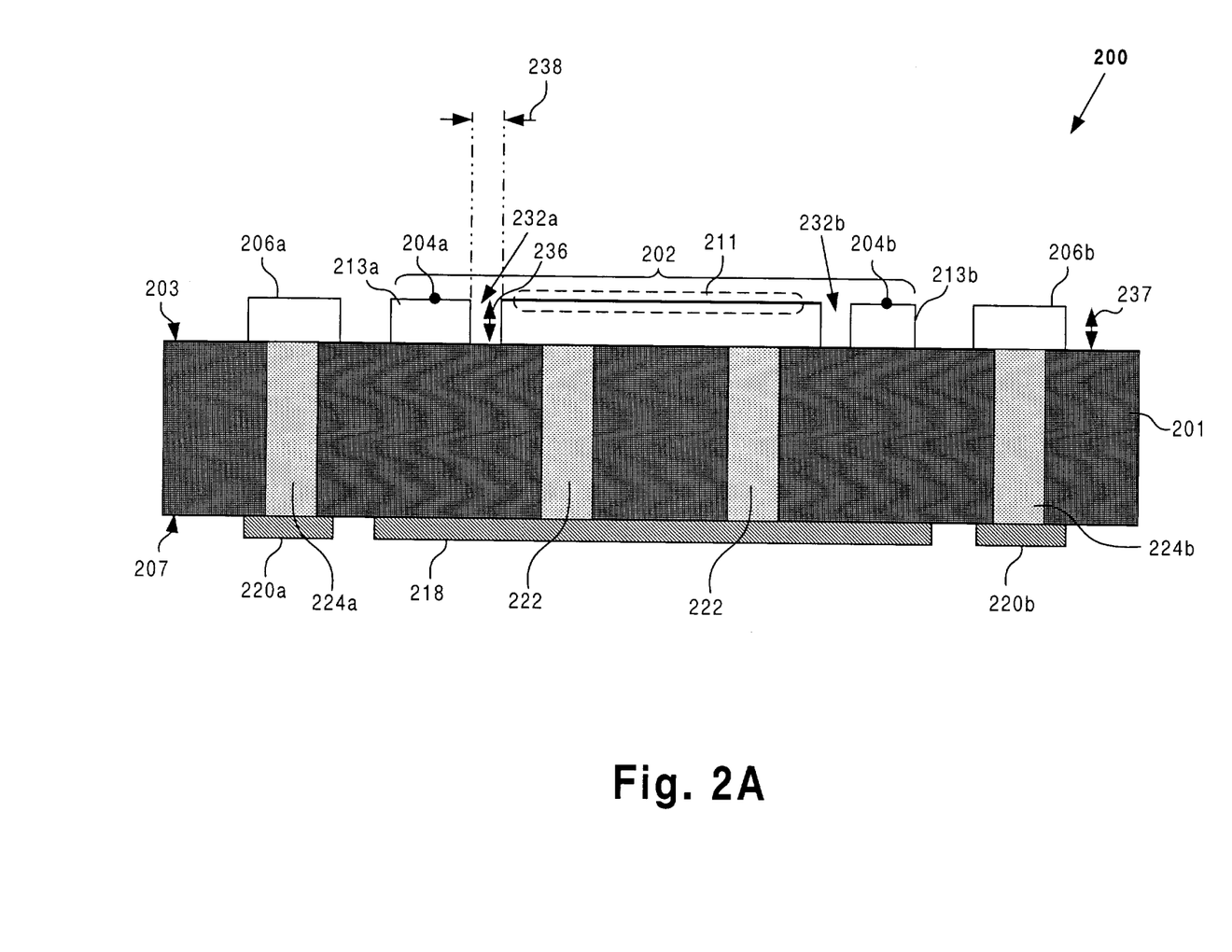
FIG. 2A illustrates a cross-sectional view of an exemplary structure in accordance with one embodiment of the present invention.

Referring now to FIG. 2A, structure 200 illustrates a cross-sectional view of an exemplary structure in accordance with one embodiment of the present invention. By way of example, structure 200 may be used in conjunction with packaging a power amplifier die suitable for use in wireless devices, such as mobile telephones. As described below, due to the particular arrangement of structure 200, greater control of die attach adhesive flow out during semiconductor packaging is achieved and, as a result, length of bond wires can be reduced, which leads to reduced inductance. Furthermore, package size can be reduced, and therefore manufacturing costs are also reduced.

As shown in FIG. 2A, structure 200 comprises substrate 201. Substrate 201 has top surface 203 and bottom surface 207, and typically comprises a non-conductive dielectric. Substrate die attach pad 202 and a number of substrate signal pads 206a and 206b are situated on top surface 203 of substrate 201. Each of substrate die attach pad 202 and substrate signal pads 206a and 206b comprises a metal or a "metal stack," such as copper over copper foil. In certain embodiments, the copper layer of substrate die attach pad 202 and substrate signal pads 206a and 206b may further be plated with gold and/or nickel.

Substrate die attach pad 202 comprises die attach region 211 and substrate ground pad regions 213a and 213b (substrate ground pad regions 213a and 213b are also referred to as "substrate ground pads 213a and 213b" in the present application). According to the particular embodiment shown in FIG. 2A, openings 232a and 232b are defined in substrate die attach pad 202 such that each substrate ground pad 213a and 213b is separated from die attach region 211 by corresponding opening 232a and 232b. Width 238 of each opening 232a and 232b may be in the range of approximately 20 to 200 microns (μm). Depth 236 of each opening 232a and 232b is approximately the same as height 237 of substrate die attach pad 202 in the particular embodiment shown in FIG. 2A, although depth 236 may be less than height 237 in other embodiments. Depth 236, for example, may be in range of about 18 to 50 μm. Landing area 204a and 204b illustrate exemplary locations where bond wires can be bonded to substrate ground pads 213a and 213b, respectively, during packaging.

Openings 232a and 232b in substrate die attach pad 202 operate as "die attach stops" and control die attach adhesive flow out during packaging by altering the "wetting" characteristics of substrate die attach pad 202 surface. More particularly, openings 232a and 232b provide an area for attracting and collecting die attach adhesive flow out during packaging. Due to the arrangement of openings 232a and 232b, die attach adhesive flow out from die attach region 211 to substrate ground pads 213a and 213b can be greatly controlled and limited. Substrate ground pads 213a and 213b, corresponding landing areas 204a and 204b, and substrate signal pads 206a and 206b can thus be moved closer to die attach region 211, resulting in shorter bond wires, ultimately achieving reduced inductance through bond wires, reduced package size and reduced manufacturing costs. Openings 232a and 232b can be fabricated, for example, by the same or similar masking and etching processes as those used to form substrate die attach pad 202 and substrate signal pads 206a and 206b on substrate 201, and thus structure 200 can be fabricated in a cost-effective manner.

Continuing with reference to FIG. 2A, lands 220a and 220b and heat spreader 218 are situated on bottom surface 207 of substrate 201. Substrate die attach pad 202 is electrically connected to heat spreader 218 by way of vias 222 while each substrate signal pad 206a and 206b is electrically connected to respective land 220a and 220b by way of via 224a and 224b, respectively. For example, sidewalls of vias 222, 224a and 224b may be plated with conductive material to form PTHs, or vias 222, 224a and 224b may be completely filled with conductive material. Lands 220a and 220b and heat spreader 218 can be connected to a printed circuit board (PCB).

Figure 2B:
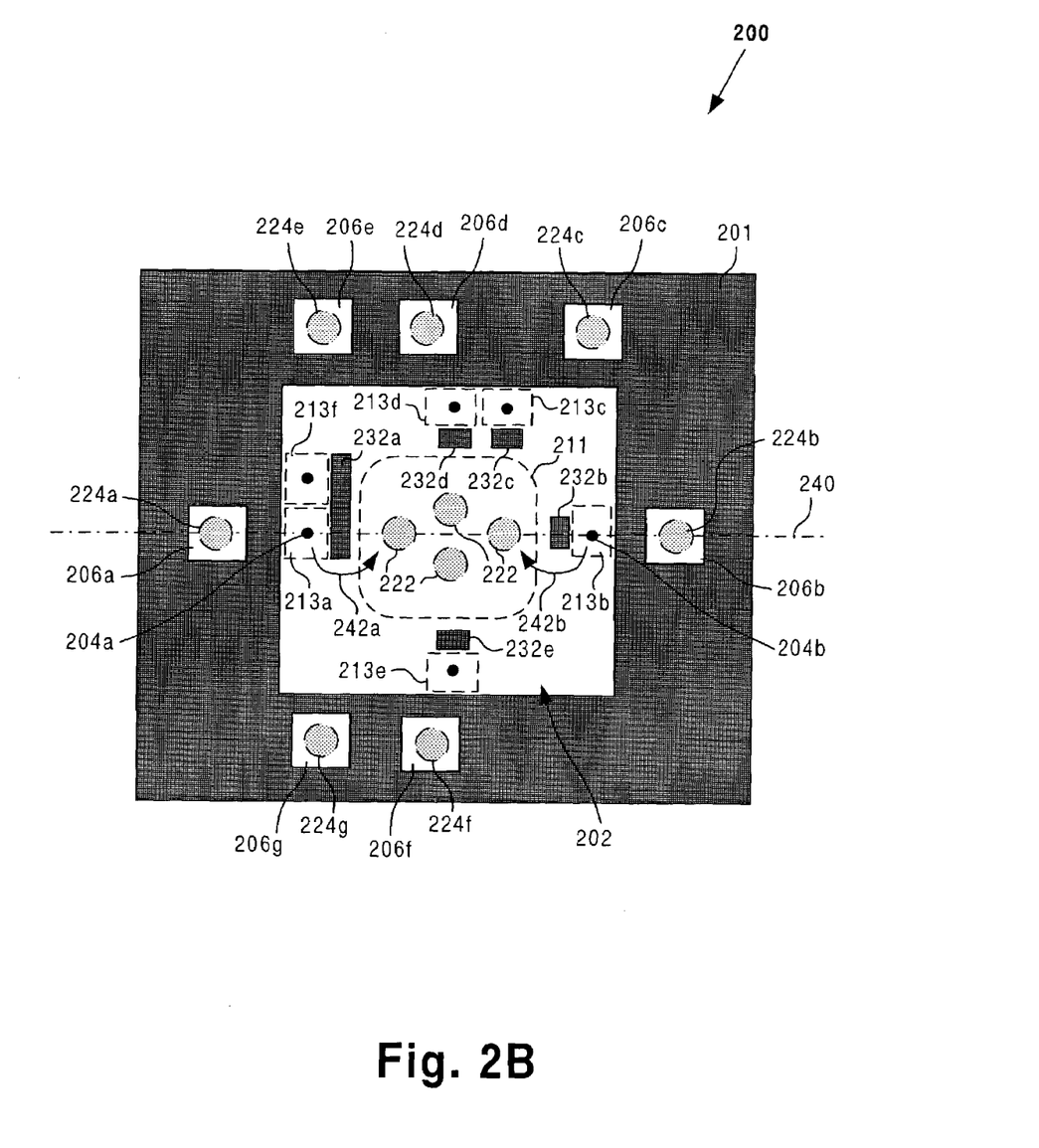
FIG. 2B illustrates a top view of the exemplary structure of FIG. 2A.

FIG. 2B shows a top view of exemplary structure 200, where the cross-sectional view of exemplary structure 200 shown in FIG. 2A is across line 240 of structure 200 in FIG. 2B. In particular, substrate 201, substrate die attach pad 202, die attach region 211, openings 232a and 232b, substrate ground pads 213a and 213b, vias 222, substrate signal pads 206a and 206b, and vias 224a and 224b correspond to the same elements in FIG. 2A and FIG. 2B. In addition, FIG. 2B further shows openings 232c, 232d and 232e, substrate ground pads 213c, 213d, 213e and 213f, substrate signal pads 206c, 206d, 206e, 206f and 206g, and vias 224c, 224d, 224e, 224f and 224g. Each of vias 222 and vias 224a through 224g is indicated by a dashed line to illustrate an exemplary position with respect to substrate die attach pad 202 and substrate signal pads 206a through 206g, respectively.

FIG. 2B more clearly illustrates how openings 232a and 232b are defined in substrate die attach pad 202 to control and limit die attach adhesive flow out to substrate signal pads 213a and 213b, respectively, as described above. Openings 232c, 232d and 232e are similarly defined in substrate die attach pad 202 and also operate to control and limit die attach adhesive flow out to substrate ground pads 213c, 213d and 213e, respectively. Also, as shown in the exemplary embodiment of FIG. 2B, opening 232a operates to control and limit die attach adhesive flow out to both substrate signal pads 213a and 213f. As described above, openings 232a through 232e provide an area for attracting and collecting die attach adhesive flow out during packaging to achieve great control of die attach adhesive flow out from die attach region 211 to substrate ground pads 213a through 213f. Substrate ground pads 213a through 213f, corresponding landing areas 204a through 204f (landing areas 204c through 204f are not specifically designated in FIG. 2B for ease of illustration), and substrate signal pads 206a through 206g can thus be moved closer to die attach region 211, resulting in shorter bond wires and achieving reduced inductance through bond wires, reduced package size and reduced manufacturing costs.

As can be seen from FIG. 2B, substrate ground pads 213a through 213f are integral with die attach region 211 of substrate die attach pad 202, and thus each substrate ground pad 213a through 213f is electrically connected to die attach region 211. Landing areas 204a through 204f indicate exemplary locations where bond wires can be bonded to substrate ground pads 213a and 213f, respectively, during packaging. Current loops 242a through 242f (current loops 242c through 242f are not specifically shown in FIG. 2B for ease of illustration) indicate the ground current paths associated with each substrate ground pad 213a through 213f when landing areas 204a through 204f are connected to ground connections on a die by way of corresponding bond wires. Ground current path continues through vias 222 to heat spreader 218 (heat spreader 218 is shown only in FIG. 2A) situated on bottom surface 207 of substrate 201. Appropriate ground connections can thus be made to heat spreader 218.

Figure 3:
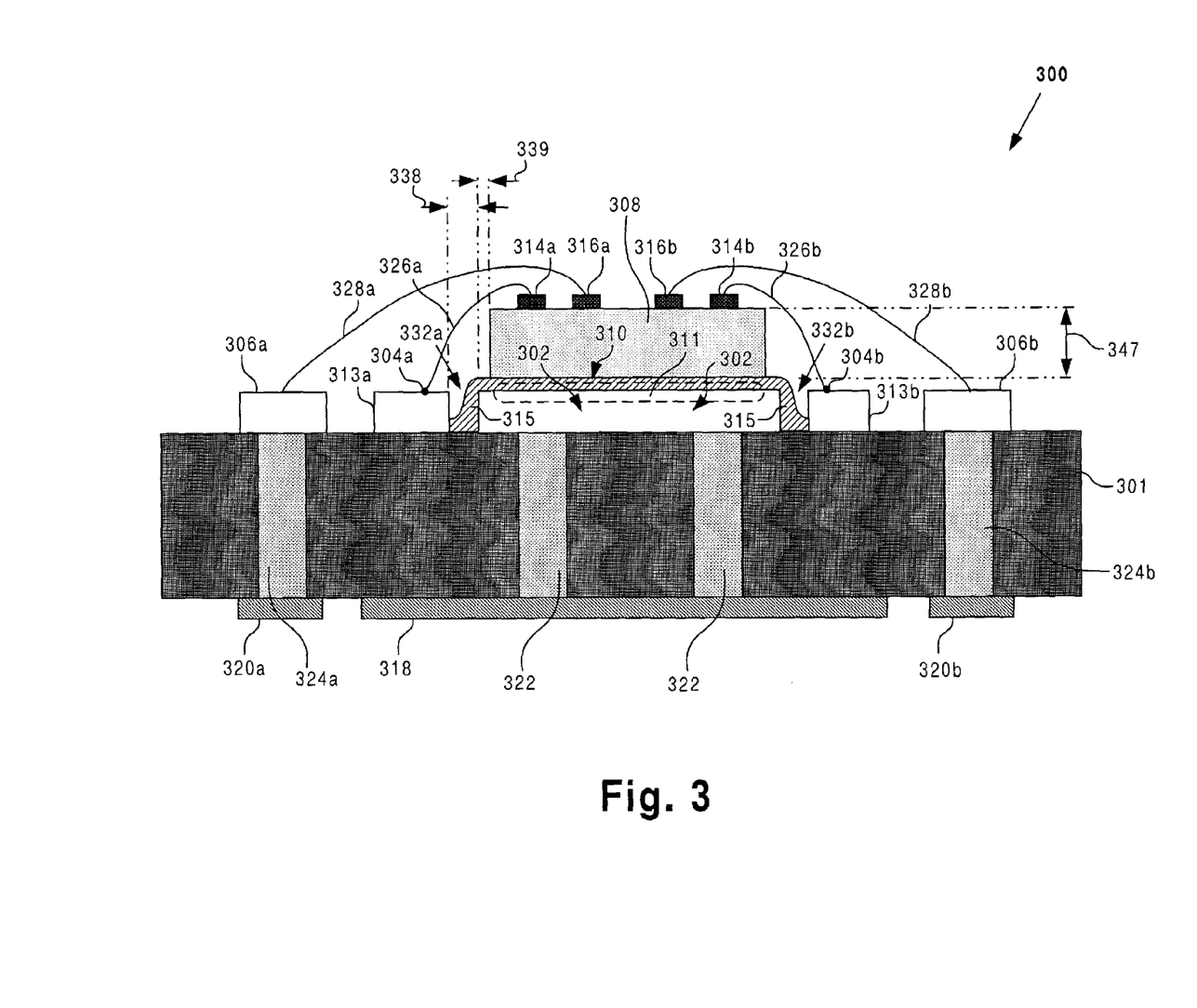
FIG. 3 illustrates a cross-sectional view of an exemplary structure in accordance with one embodiment of the present invention.

FIG. 3 shows a cross-sectional view of structure 300 showing die 308 mounted onto substrate 301 according to one embodiment of the present invention. In FIG. 3, substrate 301, substrate die attach pad 302, die attach region 311, openings 332a and 332b, substrate ground pads 313a and 313b, substrate signal pads 306a and 306b, heat spreader 318, lands 320a and 320b, and vias 322, 324a and 324b correspond to substrate 201, substrate die attach pad 202, die attach region 211, openings 232a and 232b, substrate ground pads 213a and 213b, substrate signal pads 206a and 206b, heat spreader 218, lands 220a and 220b, and vias 222, 224a and 224, respectively, in FIGS. 2A and 2B. Dimension 339, corresponding to the distance between opening 332a and the edge of die 308 (as well as the distance between opening 332b and the edge of die 308), is in the range of about 100 to 200 μm in the exemplary embodiment shown in FIG. 3.

Continuing with reference to FIG. 3, die 308 may be a power amplifier die suitable for use in wireless devices, such as mobile telephones. Height 347 of die 308 may be in the range from about 75 to 125 μm in the particular embodiment shown in FIG. 3. In FIG. 3, die 308 is attached to die attach region 311 of substrate die attach pad 302 by die attach adhesive 310. Die attach adhesive 310 typically comprises a resin having filler material, such as silver flakes. In general, die attach adhesive 310 provides thermal and electrical conductivity between die 308 and die attach region 311 of substrate die attach pad 302.

During packaging of die 308, die attach adhesive 310 is applied as a liquid onto the surface of substrate die attach pad 302, typically in die attach region 311 of substrate die attach pad 302. Die 308 is then placed on die attach adhesive 310 with sufficient pressure so as to establish adequate contact between die 308 and die attach adhesive 310. Since die attach adhesive 310 is a liquid during this process, die attach adhesive 310 flows out from under die 308 and away from die attach region 311. In the present application, die attach adhesive 310 that flows out from under die 308 is also referred to as "die attach adhesive flow out 315."

Also during packaging, a first end of bond wire 326a is bonded to die wire bond pad 314a on die 308. A second end of bond wire 326a is bonded to substrate ground pad 313a, e.g., at landing area 304a. In a similar manner, bond wire 326b electrically connects die wire bond pad 314b on die 308 to substrate ground pad 313b at landing area 304b. A first end of bond wire 328a is bonded to die wire bond pad 316a on die 308. A second end of bond wire 328a is bonded to substrate signal pad 306a. In a similar manner, bond wire 328b electrically connects die wire bond pad 316b on die 308 to substrate ground pad 306b.

As shown in FIG. 3, due to the surface characteristics of substrate die attach pad 302, an amount of die attach adhesive flow out 315 is attracted and collected into openings 332a and 332b. As shown in FIG. 3, top surface of substrate 301 is exposed by openings 332a and 332b. Since die attach adhesive 310 and substrate 301 comprise similar materials, namely, resin, die attach adhesive 310 is attracted to and becomes attached to substrate 301 and thus tends to collect in openings 332a and 332b. Additionally, since opening 332a and 332b are recessed within substrate die attach pad 302, a physical barrier is created by the walls defining openings 332a and 332b to control and limit the movement of die attach adhesive flow out 315. As a result, die attach adhesive flow out 315 away from die 308 can be readily controlled and confined by each opening 332a and 332b. As a result, substrate ground pads 313a and 313b and their associated landing areas 304a and 304b, respectively, can be moved closer to die attach region 311 and die 308. Since substrate ground pads 313a and 313b are closer to die 308, shorter bond wires 326a and 326b may be used to connect die wire bond pads 314a and 314b to respective substrate ground pads 313a and 313b. Furthermore, substrate signal pads 306a and 306b may also be moved closer to die attach region 311 and die 308, and therefore, shorter bond wires 328a and 328b may be used to connect die wire bond pads 316a and 316b to respective substrate signal pads 306a and 306b.

Due to the arrangement of structure 300, shorter bond wires 326a, 326b, 328a and 328b may be used, resulting in reduced inductance through bond wires 326a, 326b, 328a and 328b. As pointed out above, reduced inductance through the ground path, e.g., through bond wires 326a and 326b, is particularly advantageous for die 308 employing power amplifiers. As a further feature of the particular arrangement of structure 300, wherein substrate ground pads 313a and 313b and substrate signal pads 306a and 306b are moved closer to die 308, a decreased package size, and a corresponding reduction in manufacturing costs are also achieved.

Figure 4:
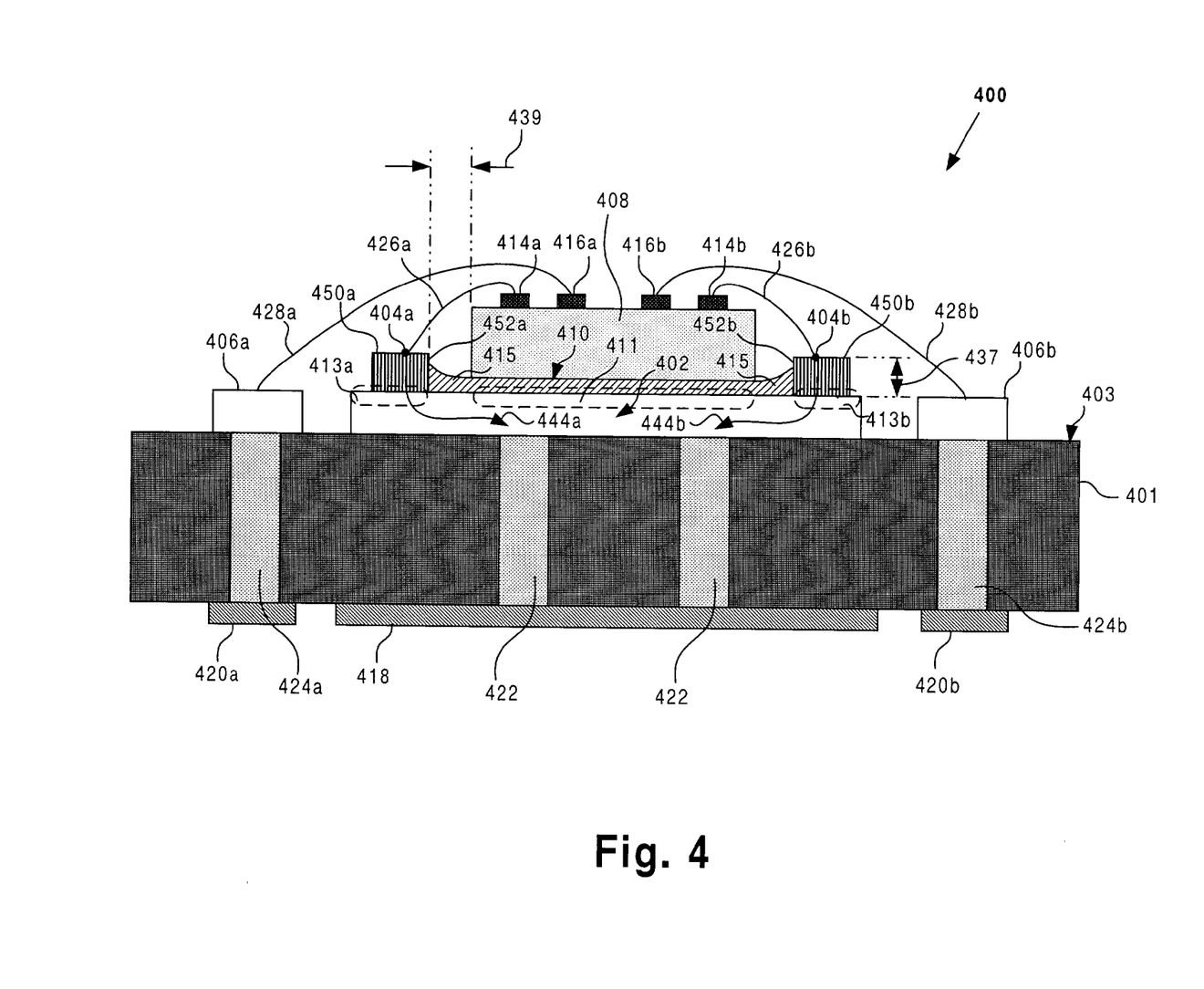
FIG. 4 illustrates a cross-sectional view of an exemplary structure in accordance with one embodiment of the present invention.

FIG. 4 shows a cross-sectional view of structure 400 showing die 408 mounted onto substrate 401 according to one embodiment of the present invention. In FIG. 4, substrate 401, heat spreader 418, lands 420a and 420b, and vias 422, 424a and 424b correspond to substrate 201, heat spreader 218, lands 220a and 220b, and vias 222, 224a and 224b, respectively, in FIGS. 2A and 2B. Substrate die attach pad 402 and substrate signal pads 406a and 406b are situated on top surface 403 of substrate 401. Each of substrate die attach pad 402 and substrate signal pads 406a and 406b comprises a metal or a "metal stack," such as copper over copper foil. In certain embodiments, the copper layer of substrate die attach pad 402 and substrate signal pads 406a and 406b may further be plated with gold and/or nickel.

Substrate die attach pad 402 comprises die attach region 411 integral with and electrically connected to substrate ground pad regions 413a and 413b. Unlike structure 200 in FIGS. 2A and 2B, and structure 300 in FIG. 3, structure 400 does not include openings in substrate die attach pad 402. Instead, structure 400 comprises "dams" 450a and 450b fabricated over and electrically coupled to substrate ground pad regions 413a and 413b, respectively, of substrate die attach pad 402. Dams 450a and 450b comprise a metal, such as copper, for example. As described below, dams 450a and 450b operate as "die attach adhesive stops" to control die attach adhesive flow out during packaging. Dimension 439, corresponding to the distance between dam 450a and the edge of die 408 (as well as the distance between dam 450b and the edge of die 408), is in the range of about 75 to 200 μm in the particular embodiment shown in FIG. 4. Height 437 of each dam 450a and 450b is typically in the range of about 10 to 100 μm. An increased elevation in height 437 of each dam 450a and 450b is desirable to minimize the height difference between die 408 and landing areas 404a and 404b of dams 450a and 450b, respectively, in order to allow angling of shorter bond wires 426a and 426b without causing shorting of bond wires 426a and 426b to the edge of die 408. Another benefit associated with the reduced height difference between die 408 and landing areas 404a and 404b of dams 450a and 450b is that the angle between bond wires, e.g., between bond wires 426a, 428a and/or other bond wires connecting die wire bond pads on die 408 to landing areas 404a and 404b, can be increased, which results in reduced mutual inductance and magnetic coupling between bond wires, and, accordingly, results in improved device performance. Furthermore, dams 450a and 450b also operate as a die placement limiter. Therefore, the difference in bond wire lengths on opposite sides of die 408, e.g., the difference in the lengths of bond wires 426a and 426b, that occur as a result of normal die attach placement variations are kept to a minimum, which results in improved device performance.

Continuing with reference to FIG. 4, die 408 may be a power amplifier die suitable for use in wireless devices, such as mobile telephones. In FIG. 4, die 408 is attached to die attach region 411 of substrate die attach pad 402 by die attach adhesive 410. Die attach adhesive 410 typically comprises a resin having filler material, such as silver flakes. In general, die attach adhesive 410 provides thermal and electrical conductivity between die 408 and die attach region 411 of substrate die attach pad 402. During packaging of die 408, die attach adhesive 410 is applied as a liquid onto the surface of substrate die attach pad 402, typically in die attach region 411 of substrate die attach pad 402. Die 408 is then placed on die attach adhesive 410 with sufficient pressure so as to establish adequate contact between die 408 and die attach adhesive 410. Since die attach adhesive 410 is a liquid during this process, die attach adhesive 410 flows out from under die 408 and away from die attach region 411. In the present application, die attach adhesive 410 that flows out from under die 408 is also referred to as "die attach adhesive flow out 415."

A first end of bond wire 426a is bonded to die wire bond pad 414a on die 408. A second end of bond wire 426a is bonded to top surface of dam 450a, e.g., at landing area 404a. In a similar manner, bond wire 426b electrically connects die wire bond pad 414b on die 408 to top surface of dam 450b at landing area 404b. As described above, each dam 450a and 450b is electrically coupled to substrate ground pad regions 413a and 413b, respectively. A first end of bond wire 428a is bonded to die wire bond pad 416a on die 408. A second end of bond wire 428a is bonded to substrate signal pad 406a. In a similar manner, bond wire 428b electrically connects die wire bond pad 416b on die 408 to substrate signal pad 406b.

As shown in FIG. 4, due to the particular arrangement of structure 400, die attach adhesive flow out 415 away from die 408 is confined by walls 452a and 452b of dams 450a and 450b; die attach adhesive flow out 415 thus being limited to a distance equal to dimension 439. As such, die attach adhesive flow out 415 away from die 408 can be readily controlled by defining distance 439 of each dam 450a and 450b from the die 408. As a result, substrate ground pad regions 413a and 413b can be moved closer to die attach region 411 and die 408. Since substrate ground pad regions 413a and 413b are closer to die 408, and since dams 450a and 450b are fabricated over substrate ground pad regions 413a and 413b, shorter bond wires 426a and 426b may be used to connect die wire bond pads 414a and 414b to substrate dams 450a and 450b, respectively. Furthermore, since substrate ground pad regions 413a and 413b are closer to die 408, substrate signal pads 406a and 406b may also be moved closer to die attach region 411 and die 408 and, therefore, shorter bond wires 428a and 428b may be used to connect die wire bond pads 416a and 416b to substrate signal pads 406a and 406b, respectively. As described above, shorter bond wires 426a, 426b, 428a and 428b results in reduced inductance. Reduced inductance through ground path bond wires, e.g., bond wires 426a and 426b, is particularly advantageous for die 408 employing power amplifiers. As a further feature of structure 400, wherein substrate ground pads 413a and 413b and substrate signal pads 406a and 406b are moved closer to die 408, decreased package size and reduced manufacturing costs are also achieved.

According to another feature of structure 400, landing areas 404a and 404b are elevated above surface of substrate die attach pad 402 by height 437 of dams 450a and 450b, respectively. As a result, landing areas 404a and 404b, where bond wires 426a and 426b are bonded, are closer to respective die wire bond pads 414a and 414b even in a dimension perpendicular to dimension 439. Therefore, even shorter bond wires 426a and 426b may be used to connect die wire bond pads 414a and 414b to dams 450a and 450b, respectively. Elevated landing areas 404a and 404b in structure 400 further compensate for the problems associated with increased die 408 thickness and the placement of die wire bond pads 414a and 414b away from the edge of die 408, which would ordinarily require longer bond wires 426a and 426b. However, because landing areas 404a and 404b are closer to respective die wire bond pads 414a and 414b by height 437, shorter bond wires 426a and 426b may be used, despite any increase in die 408 thickness and/or the placement of die wire bond pads 414a and 414b away from the edge of die 408. Yet another feature of structure 400 is the elimination of ground loops, e.g. ground loop 242a in FIG. 2B, associated with the ground current path as shown in FIG. 2B. Since openings are not implemented in structure 400, ground current path follows direct path 444a and 444b as shown in FIG. 4, which is more efficient and thus more desirable.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, it is manifest that in one embodiment, the features of structures 200, 300 and 400 can be combined. In this particular embodiment, both openings and dams, as described above, are provided in a single structure, where, for example, dams can be fabricated over substrate ground pads, and openings can be provided between a die attach region of a die attach pad and the substrate ground pads. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a semiconductor die package with reduced inductance and reduced die attach adhesive flow out has been described.

The invention claimed is:

1. A structure comprising:
a substrate having a top surface;
a die attach pad situated on said top surface of said substrate, said die attach pad having a die attach region and at least one substrate ground pad region electrically connected to said die attach region, said die attach pad further including a die attach stop between said die attach region and said at least one substrate ground pad region, wherein said die attach stop comprises an opening defined in said die attach pad between said die attach region and said at least one substrate ground pad region, wherein a depth of said opening is approximately equal to a height of said die attach pad;
a heat spreader situated on a bottom surface of said substrate, said substrate including at least one via for providing a connection between said at least one substrate ground pad region to said heat spreader;
wherein said die attach stop controls and confines die attach adhesive flow out.

2. The structure of claim 1, wherein said die attach stop comprises a dam situated over and electrically coupled with said at least one substrate ground pad region.

3. The structure of claim 2 wherein said dam comprises a top surface and a wall, said wall extending from said top surface of said darn to said at least one substrate ground pad region, said die attach stop comprising said wall.

4. The structure of claim 2 further comprising a heat spreader situated on a bottom surface of said substrate, said substrate including at least one via for providing a connection between said at least one substrate ground pad region to said heat spreader.

5. A structure comprising:
a substrate having a top surface;
a die attach pad situated on said top surface of said substrate, said die attach pad having a die attach region and at least one substrate ground pad region electrically connected to said die attach region, said die attach pad further including a die attach stop between said die attach region and said at least one substrate ground pad region, wherein said die attach stop comprises an opening defined in said die attach pad between said die attach region and said at least one substrate ground pad region, wherein a depth of said opening is approximately equal to a height of said die attach pad;
a semiconductor die fixed to said die attach region by a die attach adhesive;
a heat spreader situated on a bottom surface of said substrate, said substrate including at least one via for providing a connection between said at least one substrate ground pad region to said heat spreader;
wherein said die attach stop controls and confines die attach adhesive flow out.

6. The structure of claim 5 wherein said die attach stop comprises a dam situated over and electrically coupled with said at least one substrate ground pad region.

7. The structure of claim 6 wherein said dam comprises a top surface and a wall, said wall extending from said top surface of said dam to said at least one substrate ground pad region, said die attach stop comprising said wall.

8. The structure of claim 6 further comprising a heat spreader situated on a bottom surface of said substrate, said substrate including at least one via for providing a connection between said at least one substrate ground pad region to said heat spreader.

9. The structure of claim 6 further comprising at least one die wire bond pad on said semiconductor die, a first end of a bond wire bonded to said at least one die wire bond pad, and a second end of said bond wire bonded to a landing area on said dam.

10. The structure of claim 9 further comprising a heat spreader situated on a bottom surface of said substrate, said substrate including at least one via for providing a connection between said at least one substrate ground pad region to said heat spreader.

* * * * *

UNITED STATES PATENT AND TRADEMARK OFFICE
CERTIFICATE OF CORRECTION

PATENT NO. : 7,164,192 B2 Page 1 of 1
APPLICATION NO. : 10/364549
DATED : January 16, 2007
INVENTOR(S) : Petty-Weeks et al.

It is certified that error appears in the above-identified patent and that said Letters Patent is hereby corrected as shown below:

Column 10, line 31, "darn" should be changed to --dam--.

Column 10, line 60, "The structure of claim 5 wherein" should be changed to --The structure of claim 5, wherein--.

Signed and Sealed this

Third Day of July, 2007

JON W. DUDAS
*Director of the United States Patent and Trademark Office*